United States Patent [19]

Schlais et al.

[11] Patent Number: 5,153,143

[45] Date of Patent: Oct. 6, 1992

[54] METHOD OF MANUFACTURING CMOS INTEGRATED CIRCUIT WITH EEPROM

[75] Inventors: John R Schlais; Randy A. Rusch; Thomas H. Simacek, all of Kokomo, Ind.

[73] Assignee: Delco Electronics Corporation, Kokomo, Ind.

[21] Appl. No.: 597,459

[22] Filed: Oct. 15, 1990

Related U.S. Application Data

[62] Division of Ser. No. 484,829, Feb. 26, 1990, Pat. No. 5,014,098.

[51] Int. Cl.⁵ .................... H01L 21/265; H01L 21/70
[52] U.S. Cl. ........................................ 437/43; 437/48; 437/51; 437/56
[58] Field of Search .................... 437/43, 48, 52; 357/23.5; 185/43-52, 23.5

[56] References Cited

U.S. PATENT DOCUMENTS

| 4,608,585 | 8/1986 | Keshtbod | 357/23.5 |
| 4,701,776 | 10/1987 | Perlegos et al. | 357/23.5 |
| 4,784,966 | 11/1988 | Chen | 437/56 |
| 4,794,565 | 12/1988 | Wu et al. | 365/185 |
| 4,822,750 | 4/1989 | Perlegos et al. | 437/43 |
| 4,851,361 | 7/1989 | Schumann et al. | 437/43 |
| 4,910,565 | 3/1990 | Masuoka | 357/23.5 |
| 4,982,377 | 1/1991 | Iwasa | 357/23.5 |
| 4,989,053 | 1/1991 | Shelton | 357/23.5 |
| 5,023,694 | 6/1991 | Yeh | 357/23.5 |
| 5,036,018 | 7/1991 | Mazzali | 437/43 |
| 5,057,448 | 10/1991 | Kuroda | 437/43 |

FOREIGN PATENT DOCUMENTS

| 58-051568 | 3/1983 | Japan | 357/23.5 |
| 0110158 | 6/1984 | Japan | 357/23.5 |
| 62-004375 | 1/1987 | Japan | 357/23.5 |
| 62-102565 | 5/1987 | Japan | 357/23.5 |

Primary Examiner—Olik Chaudhuri
Assistant Examiner—Loc Q. Trinh
Attorney, Agent, or Firm—Robert J. Wallace

[57] ABSTRACT

The present invention relates to an integrated circuit which includes complementary MOS transistors (e.g., a CMOS circuit), an EEPROM, and to a method of making the integrated circuit. The EEPROM is incorporated in the circuit in such a manner that it does not adversely affect the high performance, low voltage operation of the CMOS circuit. Also, the EEPROM is designed so that it is programmable at a low voltage which is compatible with the low voltages typically used with the CMOS circuit. The EEPROM includes a floating gate and a control gate which have a large area of overlap so as to provide a high capacitance therebetween. This provides a high ratio (e.g., about two or greater) of the floating gate to control gate capacitance divided by the floating gate to substrate capacitance to provide the EEPROM with the low voltage operation. To make the integrated circuit, standard CMOS process steps using design rules of about two microns or less are used to make the MOS transistors. Additional steps are inserted in the standard CMOS process to form the EEPROM. The additional steps are inserted in such a manner so as not to adversely affect the operating characteristics of the resulting MOS transistors. For this purpose, any additional steps for forming the EEPROM which are carried out at a temperature of greater than 900° C. are done so before the gate silicon dioxide layer of the MOS transistors is formed, and any further steps for forming the EEPROM are carried out at temperatures no greater than 900° C.

34 Claims, 12 Drawing Sheets

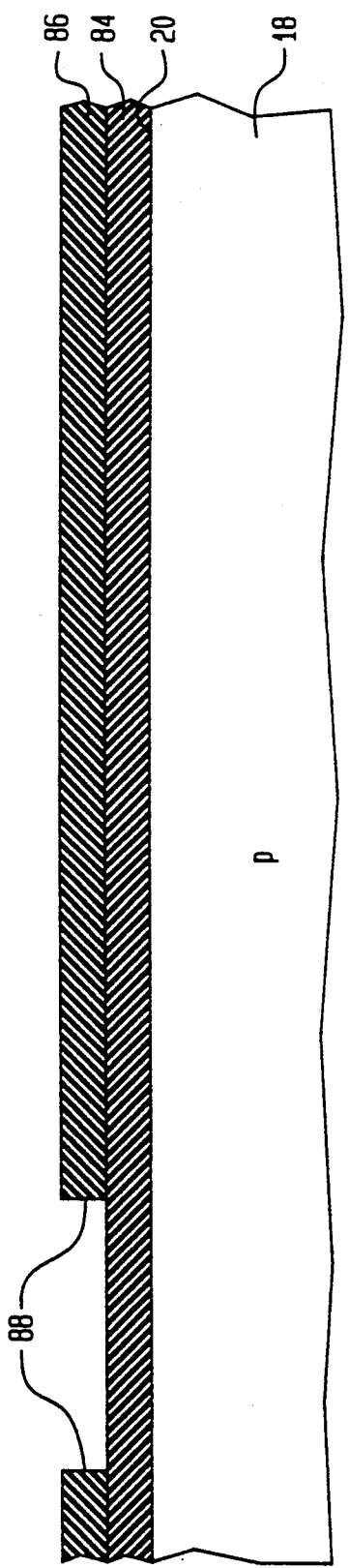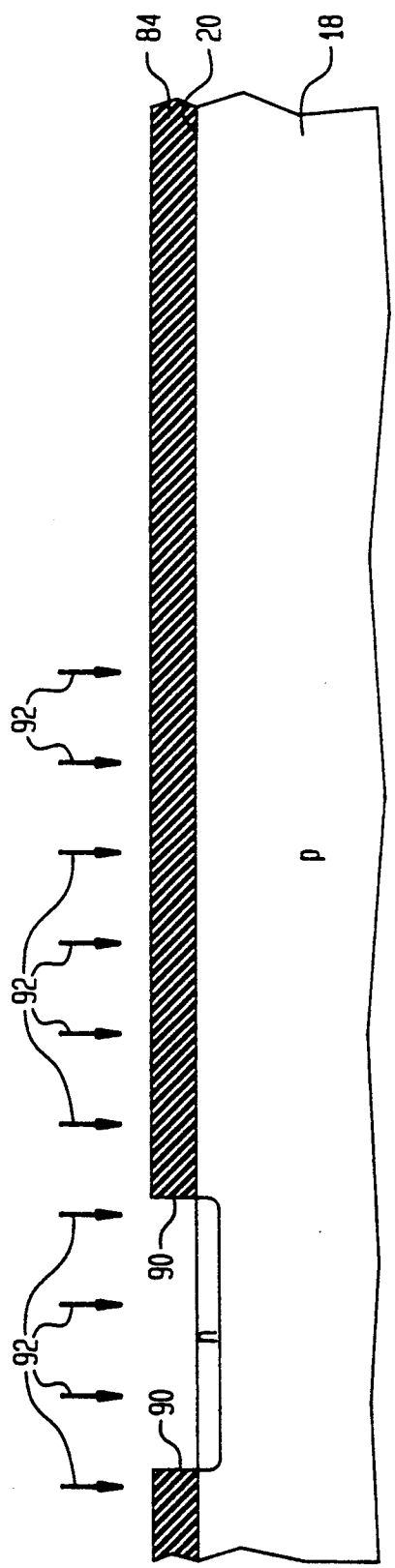

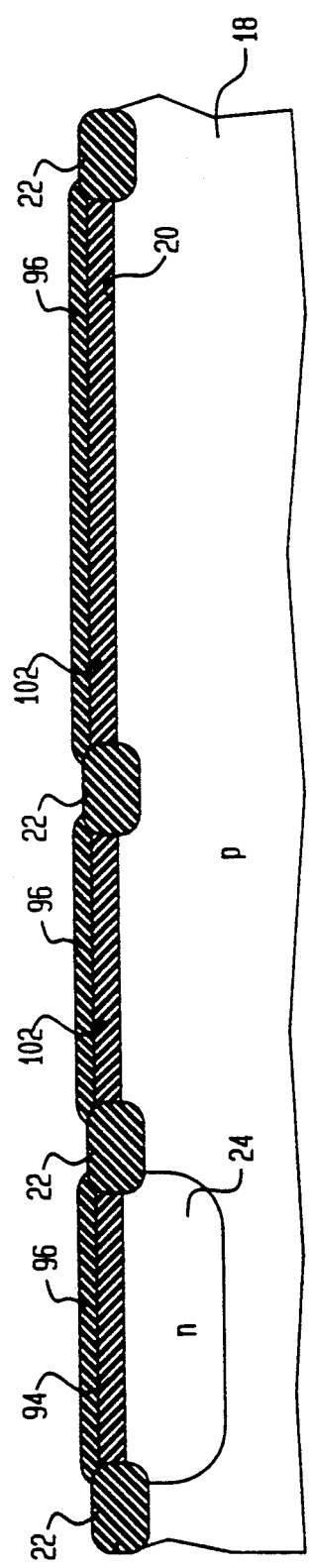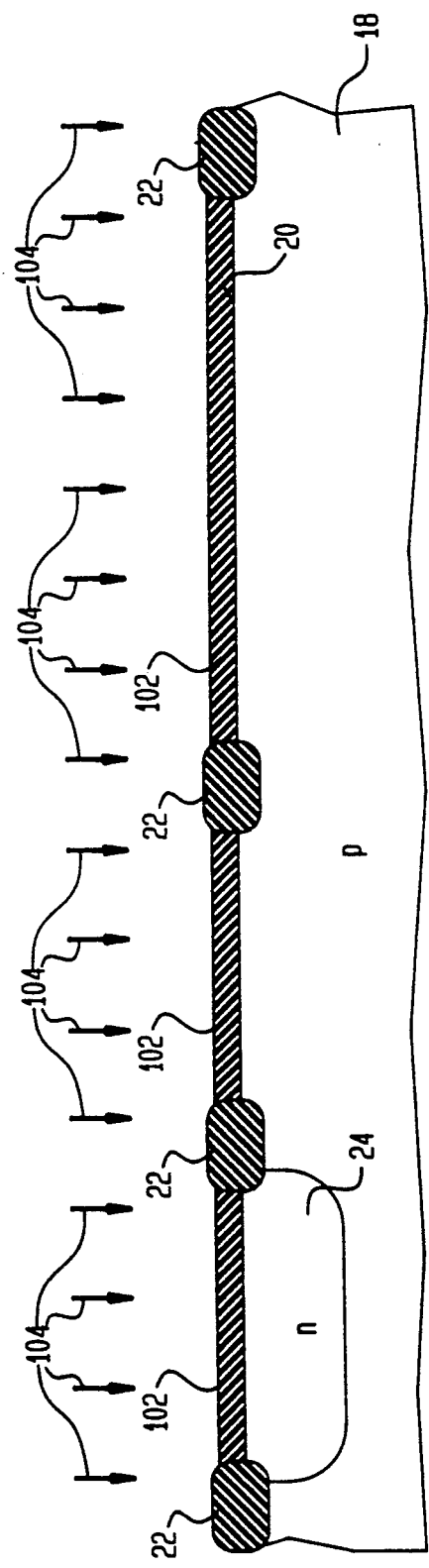

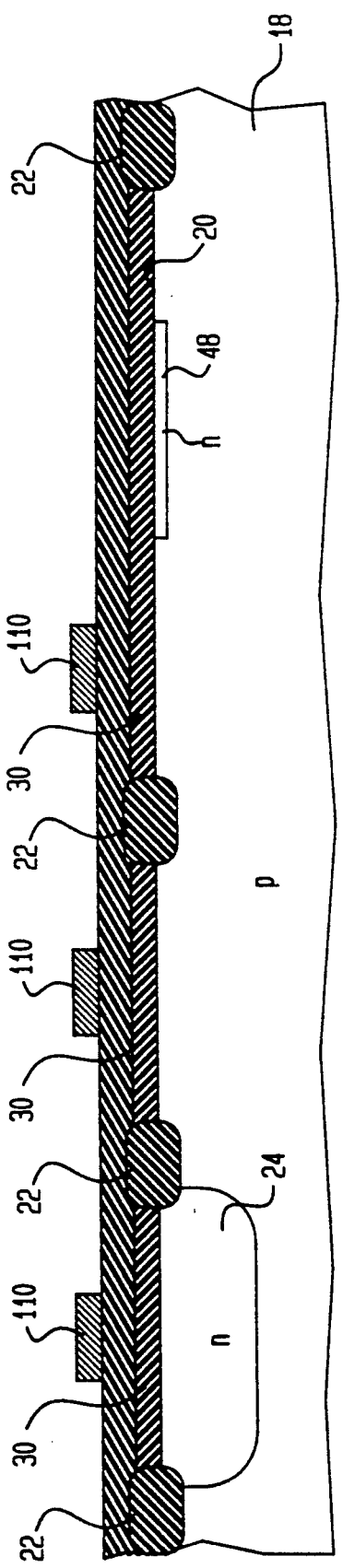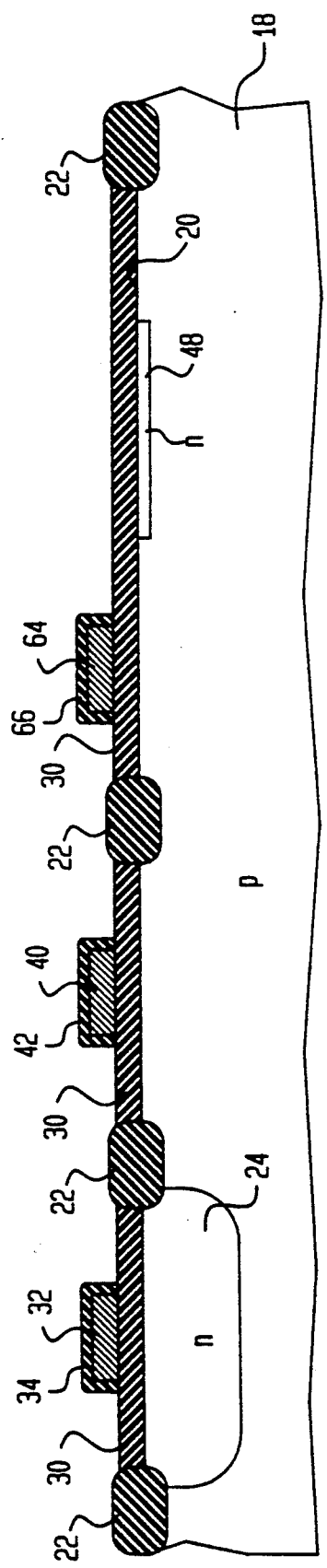

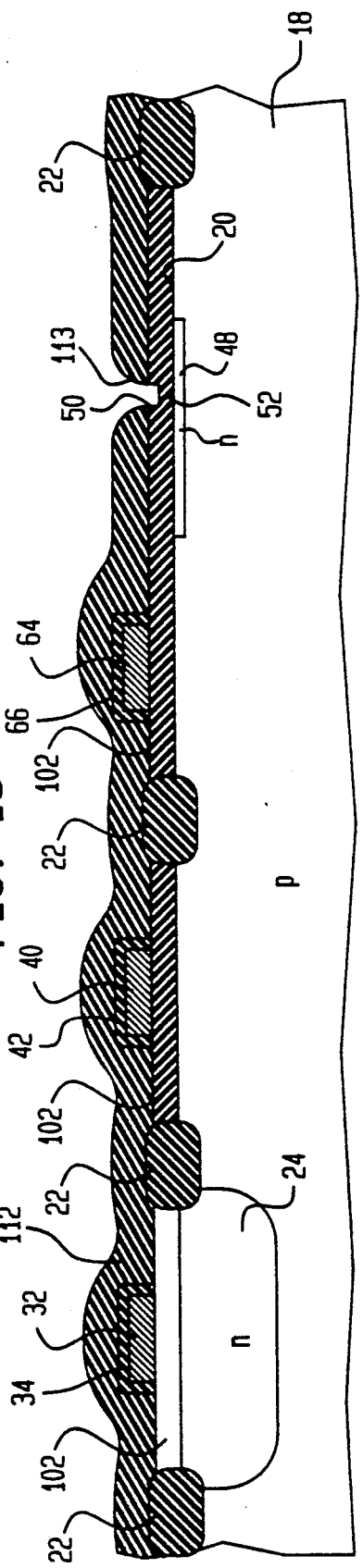
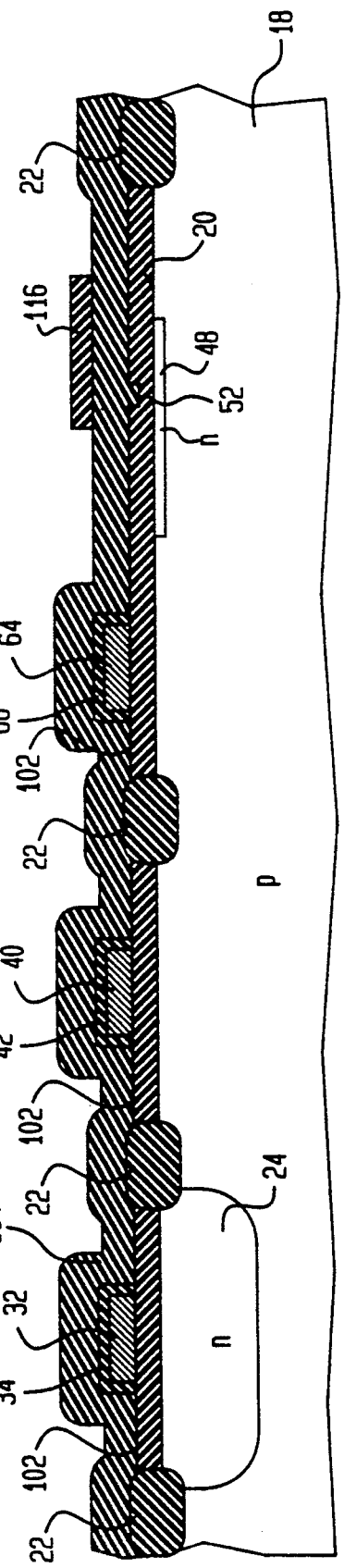

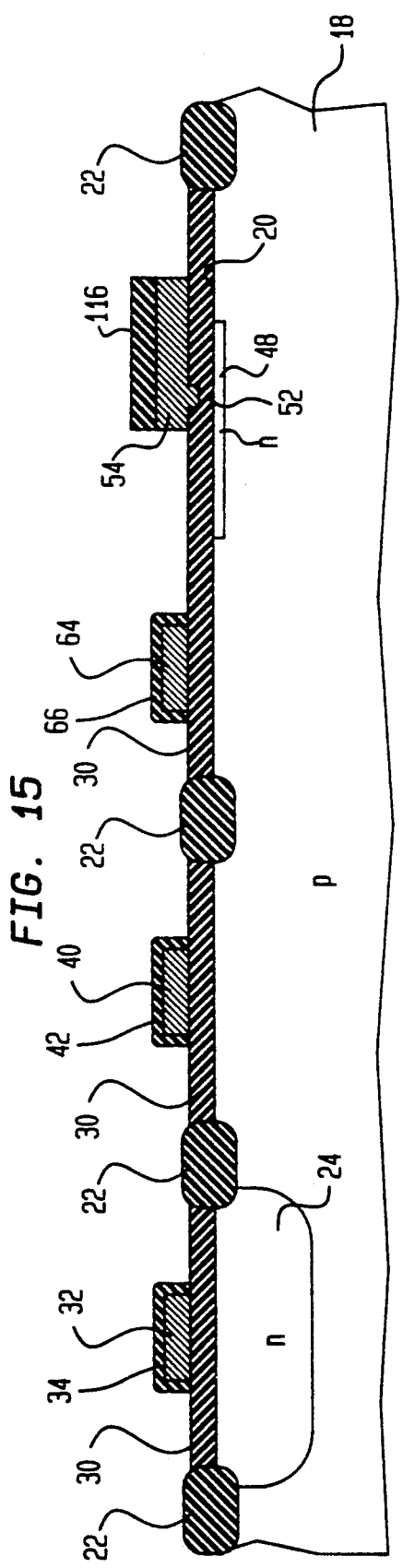
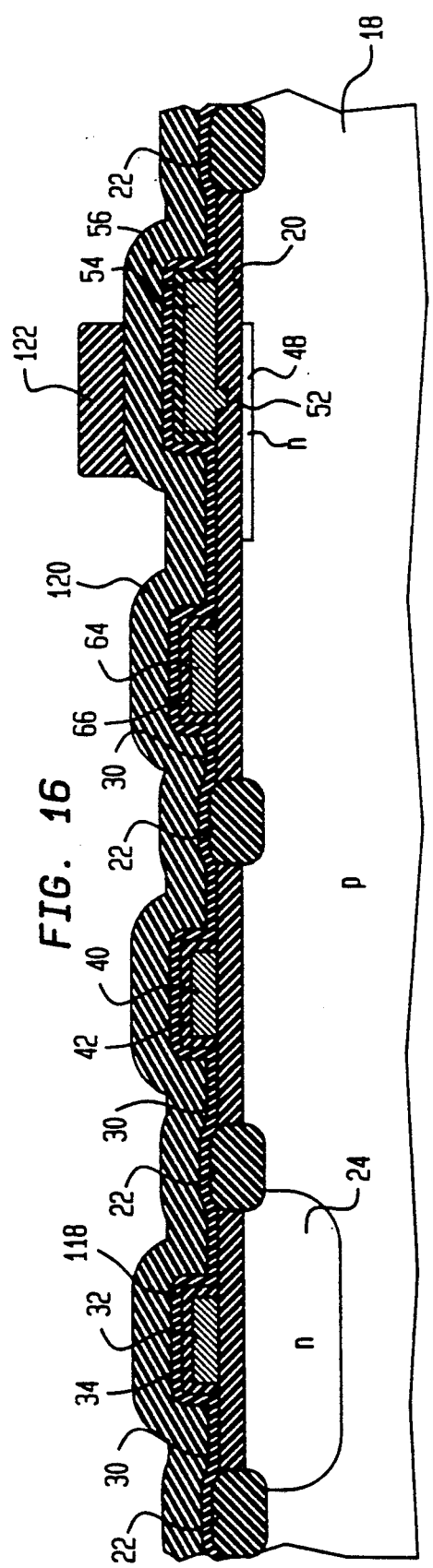

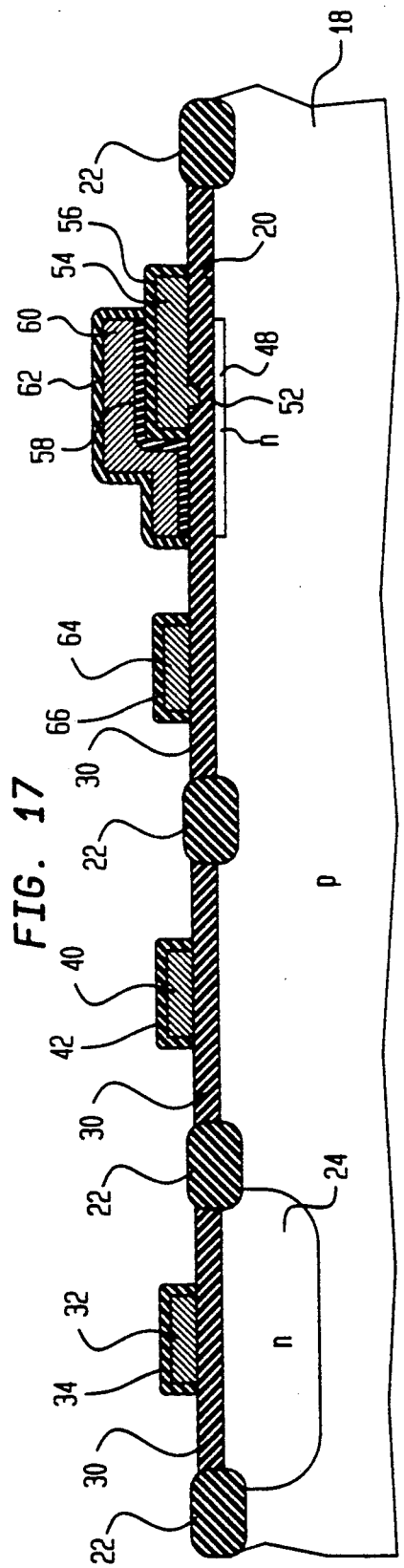
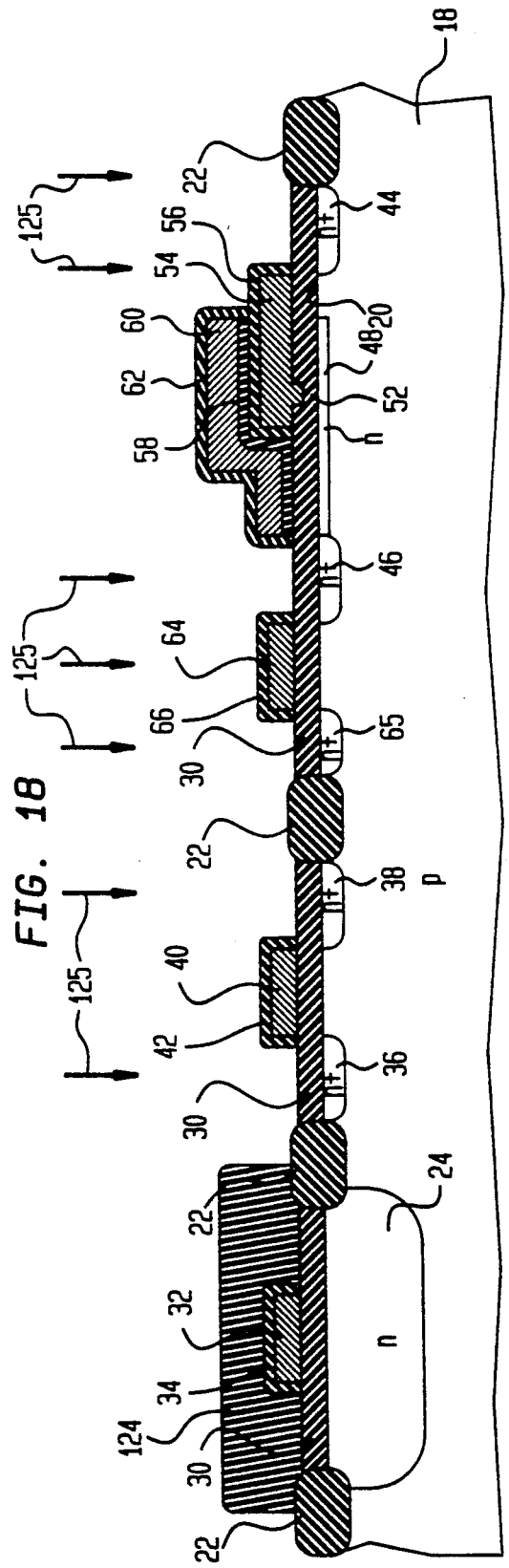
FIG. 17
FIG. 18

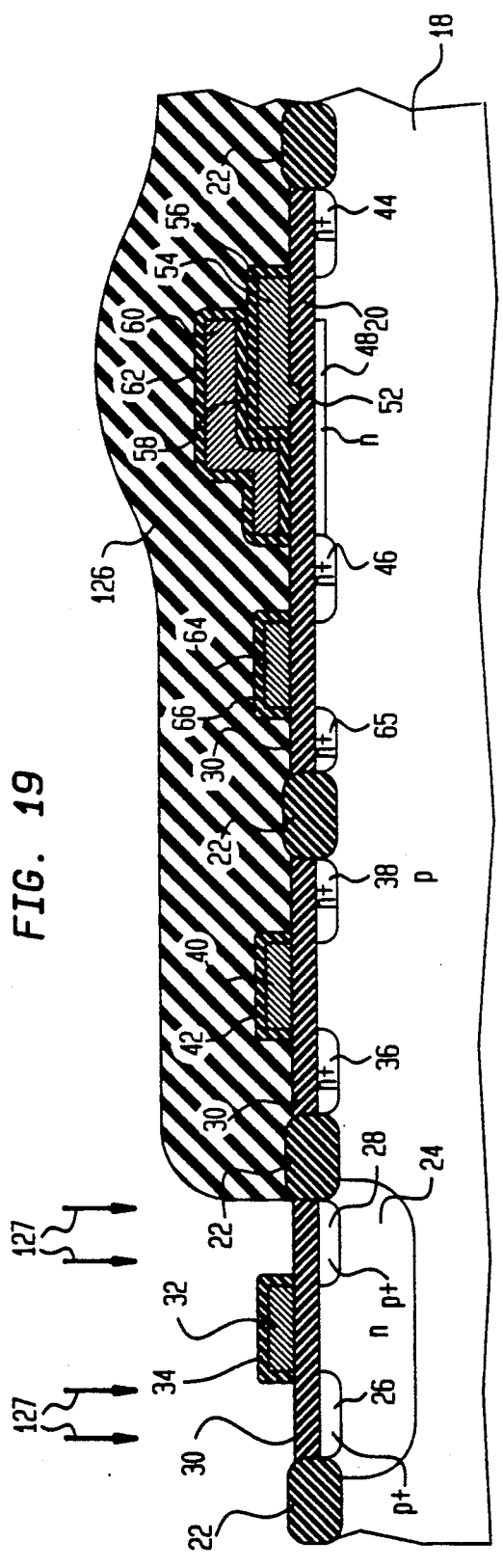
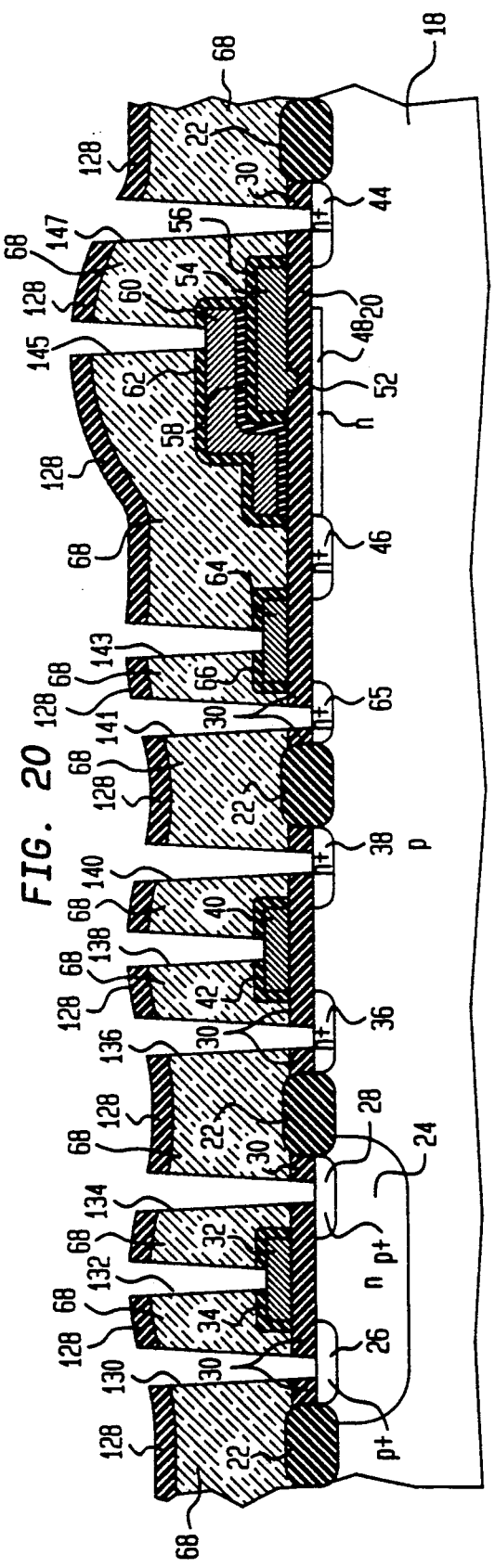

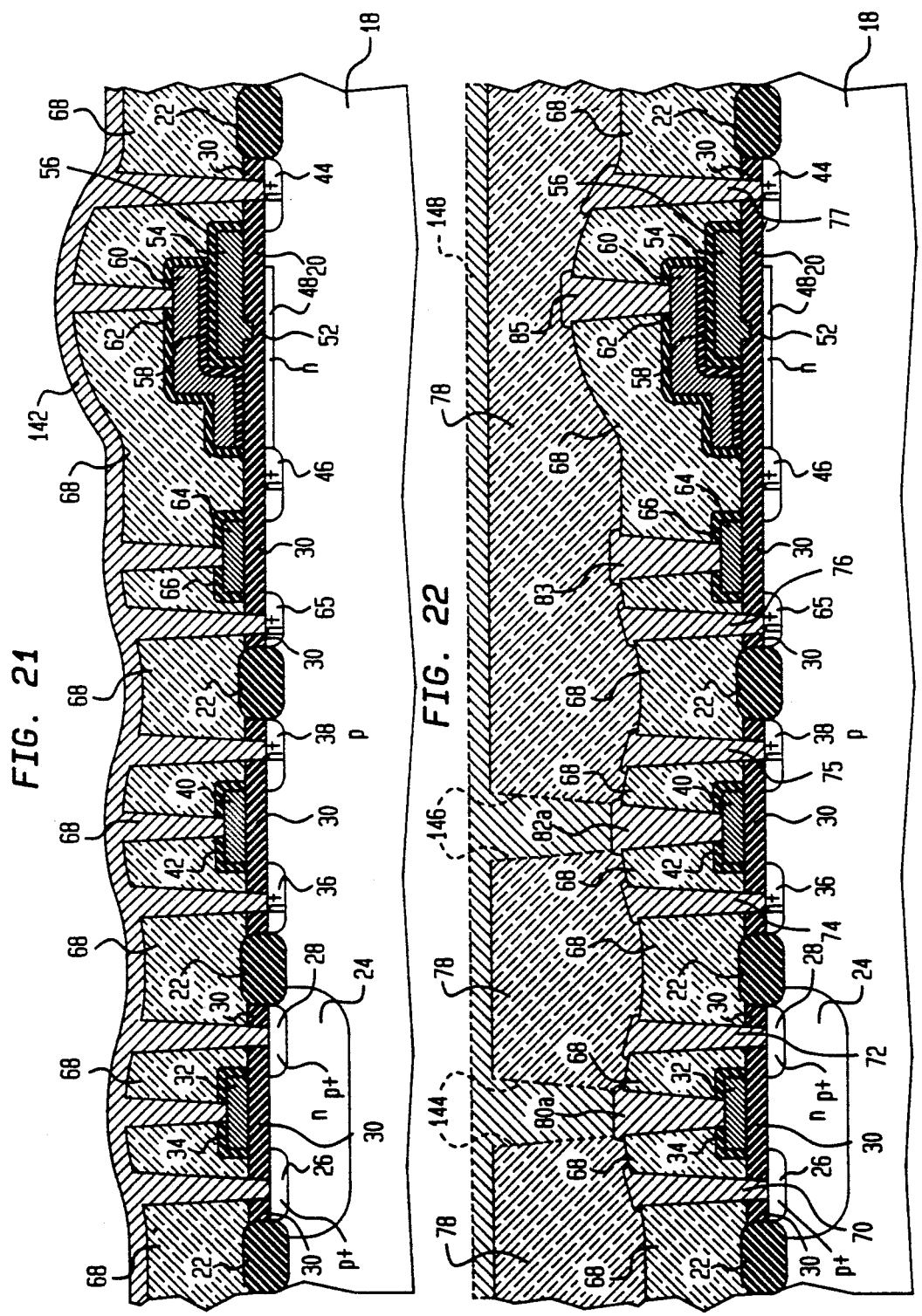

METHOD OF MANUFACTURING CMOS INTEGRATED CIRCUIT WITH EEPROM

This is a division of application Ser. No. 07/484829 filed on Feb. 26, 1990, now U.S. Pat. No. b 5,014,098.

FIELD OF THE INVENTION

The present invention relates to a CMOS integrated circuit having an EEPROM incorporated therein and method of making the same, and, more particularly, to a method of manufacturing which facilitates an EEPROM process being used with a high speed CMOS process and there being negligible impact on the CMOS process or the CMOS transistors formed.

BACKGROUND OF THE INVENTION

An electrically erasable, non-volatile, programmable memory device (EEPROM) includes a floating gate between a control gate and the semiconductor substrate. A tunnel oxide as well as a gate oxide is provided between the floating gate and the substrate and an insulating layer is provided between the two gates. To program an EEPROM cell, potential is placed on the floating gate by the capacitive coupling from the control gate to the floating gate and the coupling from the floating gate to a diffusion in the substrate beneath the floating gate. When these effects are designed correctly, the correct amount of charge is stored on the floating gate and changes the threshold of the device. This is then sensed in the support circuitry and recognized as a "1" or "0" depending on how it is programmed.

Heretofore, EEPROMs were applied, most frequently, to applications in which high density was desirable. In order to achieve this, the cell size was minimized for maximum memory packaging density. One convenient way to reduce the cell size is to use a high program voltage, allowing the size of the capacitor between the control gate and the floating gate to be small. The tunnel oxide current equation dictates an absolute value of voltage required to pass tunnel current through it for a given tunnel oxide thickness. To obtain this voltage on the floating gate, the control gate voltage has to be increased when the capacitive ratio decreases.

The voltage on the floating gate during programming is determined by the voltage on the control gate and the ratio of the control gate to floating gate capacitance divided by the floating gate to substrate capacitance. As the capacitive ratio is increased, the voltage required on the control gate to attain a given potential on the floating gate is not as great. The capacitive ratio is primarily affected by the layout of the cell, i.e., a larger cell size will typically have a larger capacitive ratio.

It is desirable to combine EEPROMs with CMOS logic circuits. When high density is desired, the EEPROMs must be designed with relatively deep source and drain junction and thick field oxides to accommodate the high voltage programming. Attempts to integrate the high density EEPROM with CMOS logic circuitry, which is typically low voltage (typically about 5 volts or less) circuitry, necessitates that the entire device be dominated in some key respects by the EEPROM high voltage circuitry. These requirements tend to degrade the performance and reliability of the high performance, low voltage logic which typically has shallow source and drain junctions and thinner oxides. The deeper junctions used in the EEPROMs require that the channel length of the CMOS logic be wider to avoid short channel effects, resulting in slower logic devices. The thick field oxide of the EEPROMs increases the lateral encroachment "bird's beak" in the CMOS logic and thus a greater limitation is present in the minimum pitch of diffusion regions. Another longer range result of this is the limited shrinkability of the device and process with a high density/high voltage EEPROM.

At present, when forming a CMOS logic circuit with EEPROMs in a stacked poly FLOTOX technology, i.e., polysilicon gates and a thin insulator for electron tunneling, compromises are required in order to insure that one of the polysilicon layers of the EEPROM can be shared with the logic device. This is usually done by one of two ways. One method is to first define the floating gate of the EEPROM. A high temperature dielectric oxide is then grown which also serves as the gate oxide of the CMOS devices. Then the second polysilicon layer is deposited and defined to form the gates of the CMOS devices and the control gate of the EEPROM. Thus, the control gate of the EEPROM is shared with the CMOS device gates. In this method the high temperature dielectric oxide tends to degrade the characteristics of the tunnel oxide of the EEPROM. This high temperature shifts the implants in the CMOS device and thus creates a shift in the electrical characteristics from the CMOS process which would not occur without the EEPROM processing. Also, a silicon dioxide dielectric along between the floating gate and the control gate of the EEPROM is not easily made a reliable dielectric.

The second method is to grow the gate oxide and then mask and etch the windows for the tunnel oxide. A pre-tunnel clean step then follows. The tunnel oxide is then grown followed by pre-polysilicon deposition clean and polysilicon deposition. The first polysilicon layer is shared between the CMOS devices and the floating gate of the EEPROM. In this method the steps required between the gate oxidation and polysilicon deposition degrade the gate oxide and thus the performance of the CMOS circuit. The gate oxide is degraded by placing photoresist on it for the tunnel mask, the pre-tunnel oxide clean, and the tunnel oxidation itself. These steps may introduce contaminants into the gate oxide and will certainly alter the thickness of it during the tunnel oxidation.

Therefore, it is desirable to have a high reliable CMOS logic circuit in which an EEPROM can be inserted using the standard method for making the CMOS circuit and with negligible impact on both the CMOS circuit and the EEPROM.

SUMMARY OF THE INVENTION

The present invention is directed to an integrated circuit which comprises electrically erasable programmable read only memory (EEPROM) integrated devices and high speed CMOS circuitry. By CMOS, I mean complementary metal oxide semiconductor circuitry, which more properly should be referred to as complementary insulated gate field effect transistor (IGFET) circuitry. Such circuitry is referred to as complementary in that it contains both p-channel and n-channel IGFETs. Ordinarily, the circuitry being referred to is logic circuitry on a monolithic integrated circuit chip, as, for example, a microprocessor chip. It is not unusual for other forms of circuitry also to be present on such a chip. The other forms of circuitry on such a chip frequently will have a larger feature size than that of the logic circuitry.

In the present invention, I focus on a circuit in which at least a portion of the other circuitry is EEPROM, and the CMOS circuitry (i.e., logic circuitry) is high speed. The EEPROM is present without adversely affecting the high speed characteristics of the CMOS circuitry. The integrated circuit is made using a CMOS process having about two micron or less design rules. By "two micron CMOS process," I mean a CMOS process having design rules allowing the mask for etching a polysilicon layer, to form IGFET gate electrodes, to have a feature size of about two microns. By feature size, I mean the width of a polycrystalline silicon gate electrode line in an integrated circuit is about two microns. With source and drain junction depths of about 0.35 micron, this results in a channel length of about 1.5 microns under the two-micron-wide gate electrode line.

IGFETs having channel lengths less than two microns are often considered to be "high speed" in logic operation. For purposes of this invention, when I refer to a "high speed CMOS process," I mean a process capable of making CMOS logic IGFETs having channel lengths of less than two microns.

The steps for forming the EEPROM are interleaved with and/or use the high speed CMOS process steps without taking away or changing any of the high speed CMOS process steps.

In addition, the particular EEPROM used is selected so that it can be made on the same chip as the high speed logic circuitry without adversely affecting logic circuitry characteristics as produced by the logic circuitry results. Accordingly, the resulting CMOS circuit maintains all of its high speed and high reliability. EEPROM is selected so as to be made by process steps that can be selected to be compatible with the high speed logic process steps. A step is compatible if it does not adversely affect the results produced by an earlier step in the high speed CMOS process (e.g., adversely increase diffusion).

In addition, in this invention, an essentially old EEPROM structure is modified by making each memory unit larger. Thus, it still substantially retains its prior characteristics but is operable at lower voltages, such as is available in the high speed logic circuitry. The EEPROM is designed such that the ratio of capacitance between its floating and control gate to the floating gate to substrate is about two or greater. More particularly, any high temperature steps used for forming the EEPROM, are accomplished before the gate oxide layer for the CMOS is formed. The remaining steps for forming the EEPROM are carried out after the gate oxide of the CMOS is protected by polysilicon so that the gate oxide is not contaminated by the remaining steps for forming the EEPROM. Also, the remaining steps of forming the EEPROM are carried out at relatively low temperatures, no greater than about 900° C., to prevent damage to the CMOS devices.

From one aspect, the present invention is directed to a method of making an integrated circuit in a substrate of a semiconductor material which includes an MOS transistor and an EEPROM comprising the steps of forming the MOS transistor using about two micron or less design rules by conventional MOS processing steps; and inserting into the conventional MOS processing steps additional steps for forming the EEPROM where the additional steps do not substantially impact the characteristics of the MOS transistor being formed and wherein the EEPROM has a control gate and a floating gate with a ratio of a floating gate to control gate capacitance to a floating gate to substrate capacitance of about two or greater.

The invention will be better understood from the following more detailed description taken with the accompanying drawings and claims.

BRIEF DESCRIPTION OF THE DRAWINGS

FIGS. 3–22 are sectional views of an integrated circuit illustrating the various steps of the method of the present invention.

It should be understood that the drawings are not necessarily drawn to scale.

DETAILED DESCRIPTION

Figure 1:
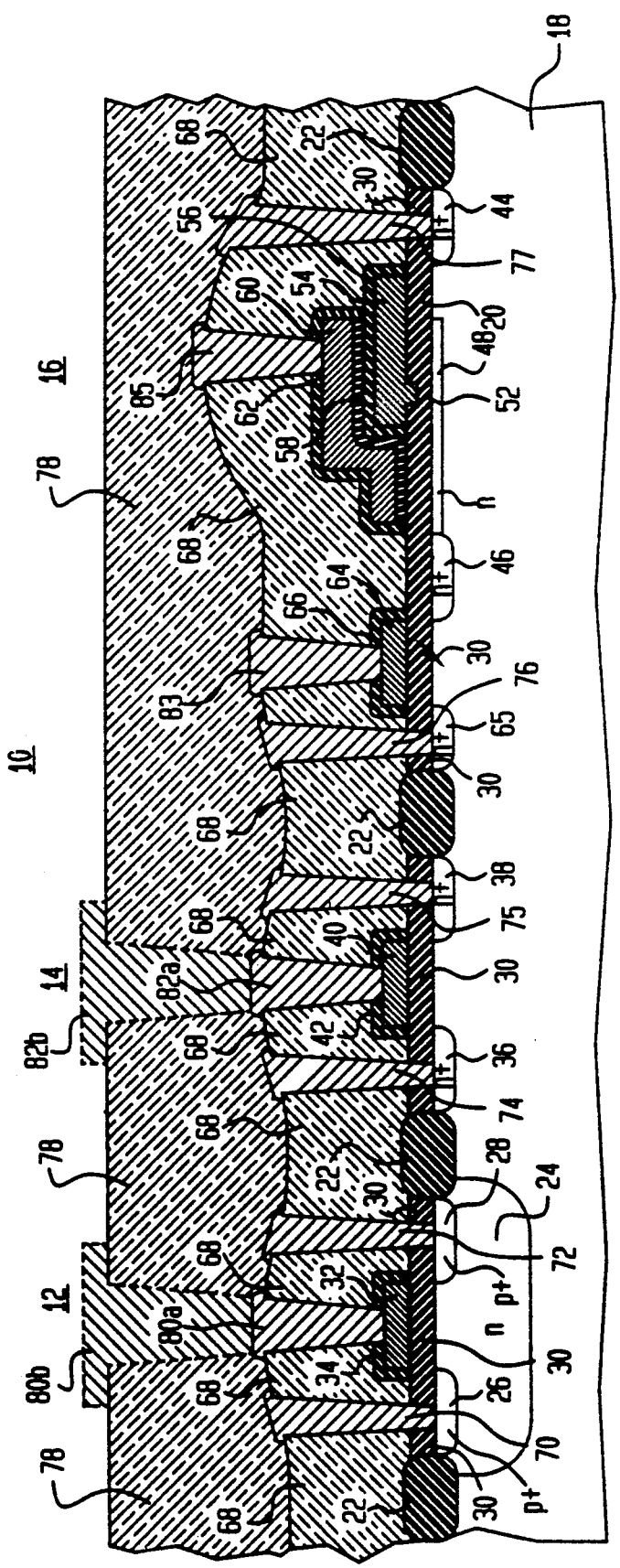
FIG. 1 is a cross-sectional view of a portion of a CMOS integrated circuit having an EEPROM therein made in accordance with the method of the present invention.

Referring to FIG. 1, there is shown a portion of an integrated circuit 10 which comprises a pair of MOS transistors 12 and 14 of opposite conductivity types and an EEPROM 16. The integrated circuit 10 is formed in a substrate 18 of a semiconductor material, such as single crystalline silicon, of one conductivity type, shown as p-type, having a major surface 20. Spaced apart along the substrate surface 20 are field isolation regions 22, typically of silicon dioxide, which dielectrically isolate the MOS transistors 12 and 14 and the EEPROM 16 from each other.

Integrated circuit 10 is formed using an essentially conventional CMOS process with EEPROM steps added thereto which do not adversely affect the high performance, relatively low operating voltage and breakdown voltages of the CMOS transistors. The EEPROM 16 is somewhat different from conventional EEPROMs in that the ratio of control gate to floating gate capacitance is increased by increasing the size of the EEPROM so it can operate, illustratively, with a programming voltage (typically about 12 volts) which is within the CMOS transistor reverse break-down voltage (typically about 17 volts) of the conventional CMOS transistors which are fabricated using 2 micron or less design rules (i.e., the minimum size of a feature or the spacing between adjacent features).

The MOS transistor 12 is formed in a well 24 of n-type conductivity which extends into the substrate 18 from the surface 20 between two of the field isolation regions 22. Spaced-apart source and drain regions 26 and 28 of p-type conductivity extend into the well 24 from the substrate surface 20 and provide a channel region therebetween. A thin gate oxide layer 30, typically of silicon dioxide of a thickness of about 400 Angstroms, is on the substrate surface 20. A conductive gate 32, typically of doped polycrystalline silicon, is on top of the gate oxide layer 30 over the substrate surface 20 between the source and drain regions 26 and 28. The gate 32 is covered with a thin layer 34 of silicon dioxide. The MOS transistor 14 is formed directly in a portion of the substrate 18 between two field isolation regions 22. The MOS transistor 14 comprises spaced source and drain regions 36 and 38 of n-type conductivity extending into the substrate 18 from the surface 20 and providing a channel region therebetween. The gate oxide layer 30 also extends across the portion of the substrate surface 20 in which the MOS transistor 14 is formed. A conductive gate 40, typically of doped polycrystalline silicon, is on top of the gate oxide layer 30 over the substrate surface 20 between the source and drain regions 36 and 38. The gate 40 is covered with a thin layer 42 of silicon dioxide. The channel regions between the drain and source regions of transistors 12 and 14 are of a length of about 2 microns or less.

The EEPROM is in a portion of the substrate 18 between two field isolation regions 22. The EEPROM comprises spaced source and drain regions 44 and 46 of n-type conductivity extending into the substrate 18 from the surface 20. A drain extension 48 of n-type conductivity but shallower than the drain 46 is in the substrate 18. The drain extension 48 extends from the drain 46 across a portion of the substrate surface 20 toward the source 44. The gate oxide layer 30 also extends across the portion of the substrate surface 20 in which the EEPROM 16 is formed. The gate oxide layer 30 has a window 50 therein over the drain extension 48. A thin tunnel oxide layer 52, typically of silicon dioxide and of a thickness of about 100 Angstroms, is on the substrate surface 20 within the window 50. A conductive floating gate 54, typically of doped polycrystalline silicon, is on the gate oxide layer 30 across a portion of the substrate surface 20 between the source and drain regions 44 and 46 and on the tunnel oxide layer 52. The top surface and one end of the floating gate 54 is coated with a dielectric which comprises a thin layer 56 of silicon dioxide and a thin layer 58 of silicon nitride. A conductive control gate 60 is on the silicon nitride layer 58 and extends over the top surface and one end of the floating gate 54. The control gate 60 is typically of doped polycrystalline silicon. A thin layer 62 of silicon dioxide covers the control gate 60. A row select line comprises a MOS transistor formed by a conductive gate 64 on the gate oxide layer 30. The gate 64 is between the drain region 46, which serves as the source of the MOS transistor, and a drain region 65 of n-type conductivity extending into the substrate 18 from the surface 20. The gate 64 is typically of doped polycrystalline silicon and is coated with a layer 66 of silicon dioxide.

A passivation layer 68 of a highly doped phosphorus doped silicon dioxide extends over the substrate surface 20 to cover the MOS transistors 12 and 14 and the EEPROM 16. Various substitutes can be used for the layer 68 such as Boro-phospho Silicate Glass (BPSG). First level metal contacts 70 and 72 extend through the passivation layer 68 to the source and drain regions 26 and 28, respectively, of the MOS transistor 12 and metal contacts 74 and 75 extend through the passivation layer 68 to the source and drain regions 36 and 38, respectively, of the MOS transistor 14. The first level metal contacts 76 and 77 extend through the passivation layer 68 to the drain region 65 of the row select line MOS transistor and to the source region 44, respectively, of the EEPROM 16. A second passivation layer 78, also of a glass dielectric material, is over the passivation layer 68 and the contacts 70, 72, 74 and 76. Second level metal contacts 80b and 82b extend through the passivation layer 78 and make electrical contact with first level metal contacts 80a and 82a, respectively, of the MOS transistors 12 and 14, respectively. The second level metal contacts 80b and 82b are shown in dashed lines since generally they do not contact the respective first level metal contacts directly over the transistors 12 and 14. Additional second level metal contacts, not shown, also extend through the passivation layer 78 and contact first level metal contacts 70, 72, 74, 75, 76, 77, 83 and 85.

Figure 2:
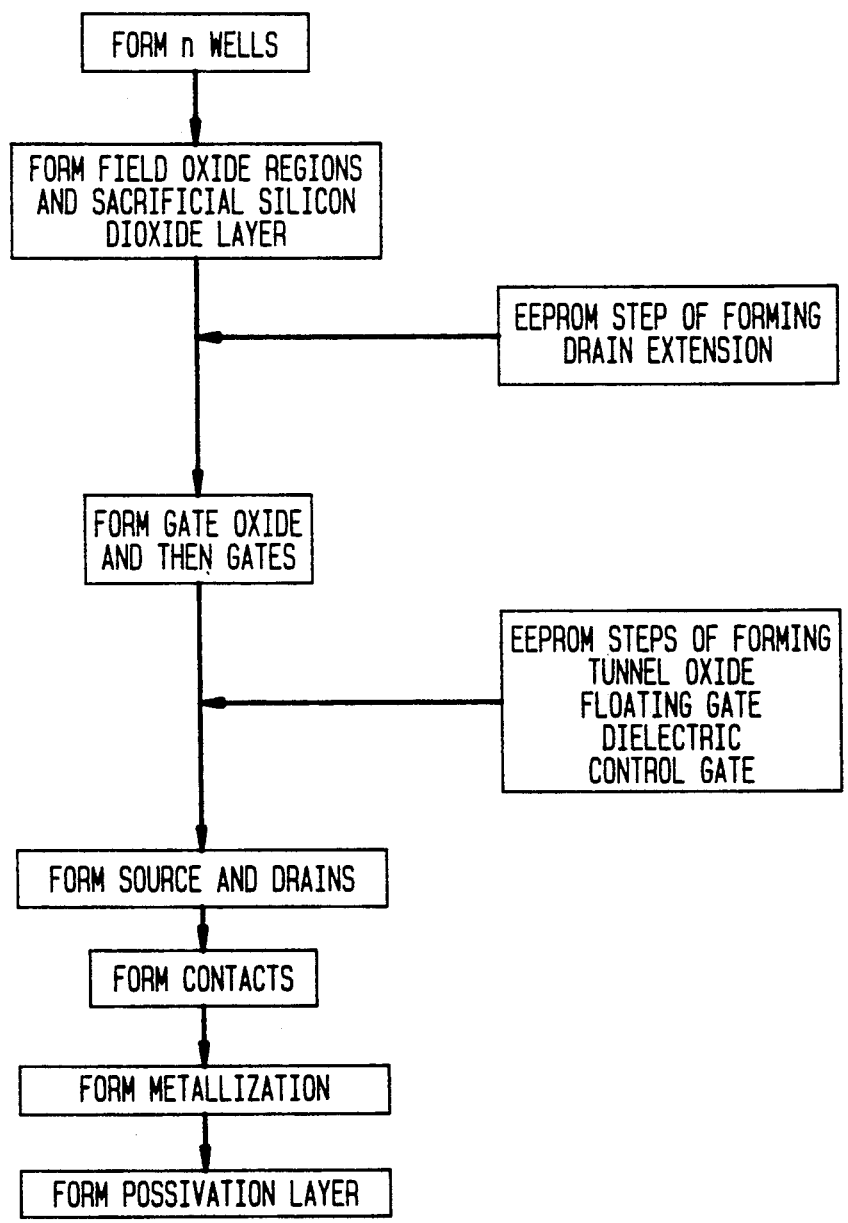
FIG. 2 is a flow chart of the method of the present invention.

FIG. 2 is a flow chart showing the steps of the method of the present invention for making the integrated circuit 10 shown in FIG. 1. The left-hand column of boxes indicates the steps of a standard process for making a CMOS integrated circuit which includes the MOS transistors 12 and 14. The two boxes on the right-hand side of the chart indicated the additional steps which are inserted directly into the standard CMOS process for including the EEPROM 16 in the integrated circuit 10. As will be explained in more detail, the EEPROM steps are inserted in accordance with the present invention in such a way that they do not interfere with the standard CMOS process or adversely affect the characteristics of the resulting CMOS circuit.

FIGS. 3–22 are sectional views illustrating in more detail the various steps of the method of the present invention for making the integrated circuit 10. As shown in FIG. 3, the method starts with a substrate 18 of single crystalline silicon of p-type conductivity. An initial layer 84 of silicon dioxide of a thickness of about 5500 Angstroms is formed on the surface 20 of the substrate 18. This can be achieved by heating the substrate 18 in an oxidizing atmosphere at a temperature of about 1000° C. A layer 86 of a photoresist is then applied over the initial oxide layer 84, and, using standard photolithographic techniques, an opening 88 is provided in the photoresist layer 86 over the area of the substrate surface 20 where the well 24 is to be formed.

The portion of the initial oxide layer 84 exposed by the opening 88 in the photoresist layer 86 is then removed, such as by etching with buffered hydrofluoric acid, to provide an opening 90 through the oxide layer 84 as shown in FIG. 4. The photoresist layer 86 is then removed with a suitable etchant, such as a mixture of sulfuric acid and hydrogen peroxide. Ions of an n-type conductivity modifier, such as phosphorous ions, are then implanted into the substrate 18 through the opening 90 in the oxide layer 84 as indicated by the arrows 92 in FIG. 4. The substrate 18 is then heated to drive the phosphorus ions into the substrate 18 and thereby form the well 24.

Figure 5:
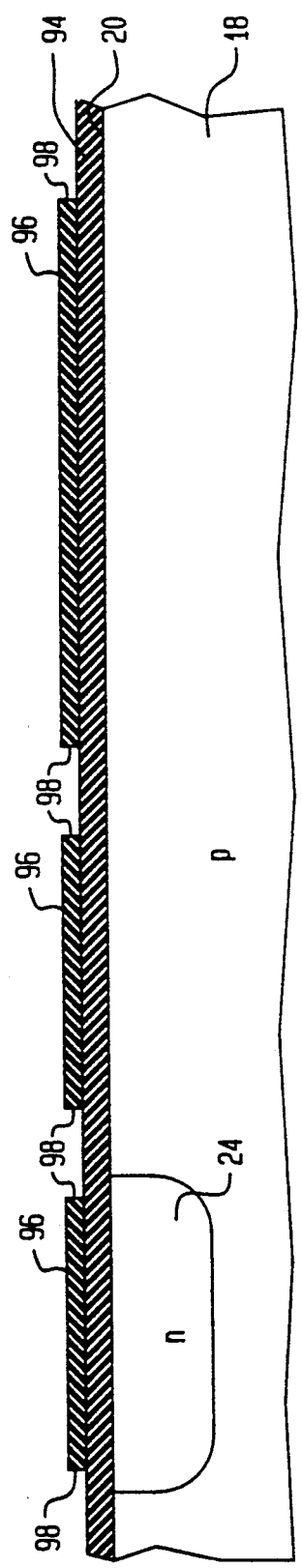

The initial silicon dioxide layer 84 is then removed with a suitable etchant, such as buffered hydrofluoric acid, and a second silicon dioxide layer 94 is grown on the substrate surface 20 as shown in FIG. 5. The second oxide layer 94 is of a thickness of about 500 Angstroms. A layer 96 of silicon nitride about 2000 Angstroms in thickness is then deposited on the second silicon dioxide layer 94. This can be achieved by a low pressure chemical vapor deposition process wherein the substrate 18 is exposed to a mixture of a gas containing silicon, such as silane, and a gas containing nitrogen, such as ammonia. The gaseous mixture is heated to a temperature at which they decompose and form silicon nitride which deposits on the second oxide layer 94. A layer of photoresist, not shown, is applied over the silicon nitride layer 96 and is defined, using standard photolithographic techniques, to provide openings therethrough over the area of the substrate surface 20 where the field oxide regions 22 are to be formed. The portions of the nitride layer 96 exposed by the openings in the photoresist layer are then removed with a suitable etchant to provide openings 98 in the silicon nitride layer 96 as shown in FIG. 5.

Figure 6:
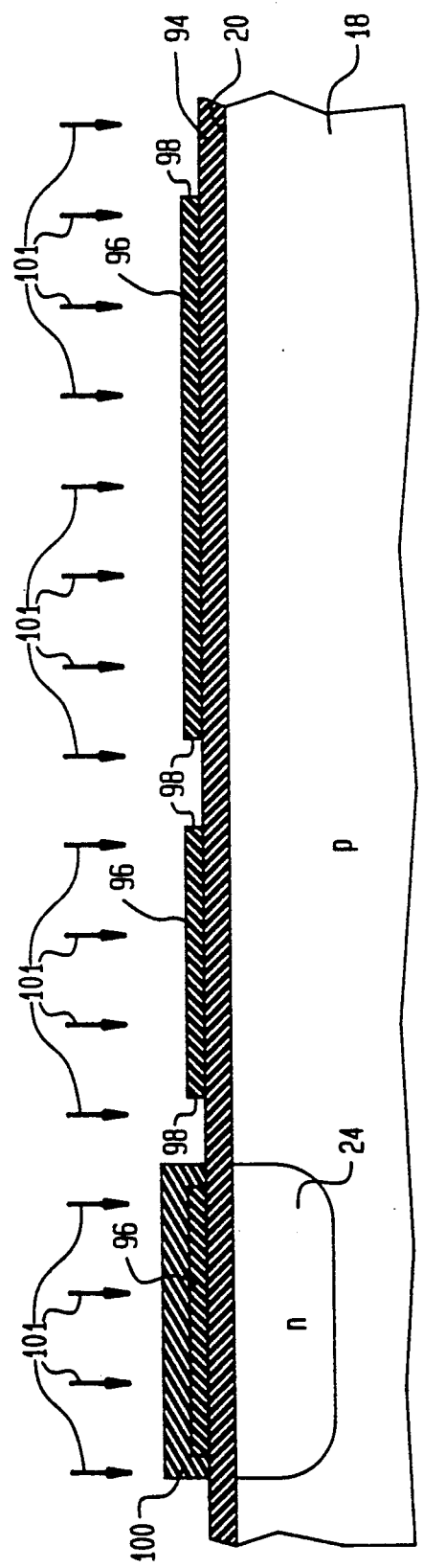

As shown in FIG. 6, the portion of the silicon nitride layer 96 over the well 24 is then coated with a masking layer 100, such as of a photoresist. Ions of a p-type conductivity modifier, such as boron, are then implanted through the openings 98 in the silicon nitride layer 96 into the substrate 18 as indicated by the arrows 101 in FIG. 6. The masking layer 100 is then removed with a suitable etchant. The substrate 18 is then heated in an oxidizing atmosphere at temperature of about 1000° C. to form the field oxide regions 22 in the openings 98 in the silicon dioxide layer 96 as shown in FIG. 7. The field oxide regions are initially of a thickness of about 8500 Angstroms.

The silicon nitride layer 96 and the second oxide layer 94 are then removed in succession using a suitable etchant for each material. A sacrificial layer 102 of silicon dioxide of a thickness of about 400 Angstroms is then formed on the substrate surface 18. Ions of a p-type conductivity modifier, such as boron, are then implanted through the sacrificial oxide layer 102 into the substrate 18 as indicated by the arrows 104 in FIG. 8 to increase the threshold voltages of the transistors 12 and 14 and the transistor of the EEPROM 16. The boron ions are typically implanted at a dosage of $1.35 \times 10^{12}$ atoms/icm$^2$ and at an energy of 35 KeV. The steps of the present invention up to this point are standard steps for making a CMOS integrated circuit as indicated in the first two boxes of the flow chart of FIG. 2. At this point some initial additional steps for making the EEPROM are inserted into the standard CMOS process.

Figure 9:
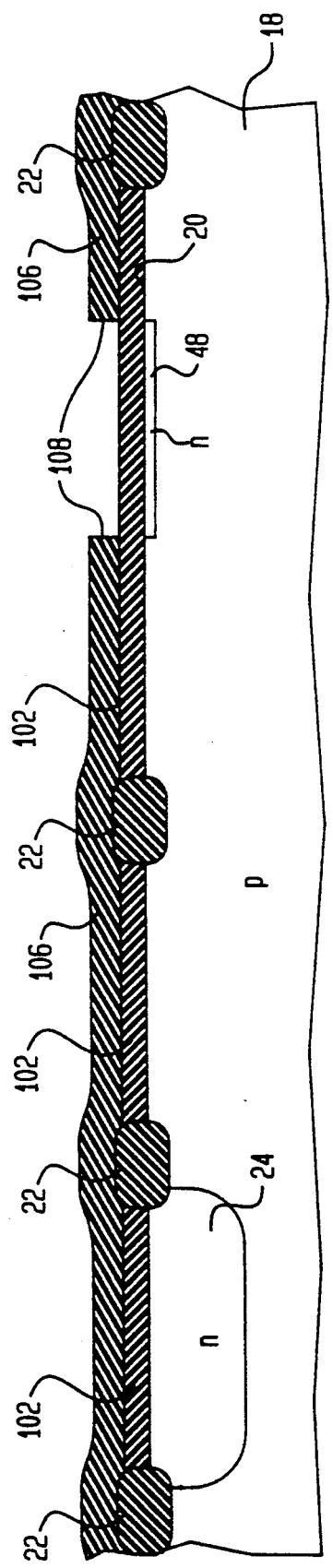

The initial additional, steps comprise first applying a making layer 106 of a photoresist over the sacrificial oxide layer 102 and the field oxide regions 22 as shown in FIG. 9. Using standard photolithographic techniques, an opening 108 is formed in the masking layer 106 over the area of the substrate surface 18 where the EEPROM drain extension 48 is to be formed. Ions of an n-type conductivity modifier, such as arsenic, are then implanted through the opening 108 into the substrate 18 to form the EEPROM drain extension 48. The ions are typically implanted at a dosage of $1 \times 10^{15}$ atoms/cm$^2$ and at an energy of 100 KeV. The masking layer 106 and the sacrificial oxide layer 102 are then removed in succession with suitable etchants. The process now returns back to the standard CMOS process.

Figure 10:
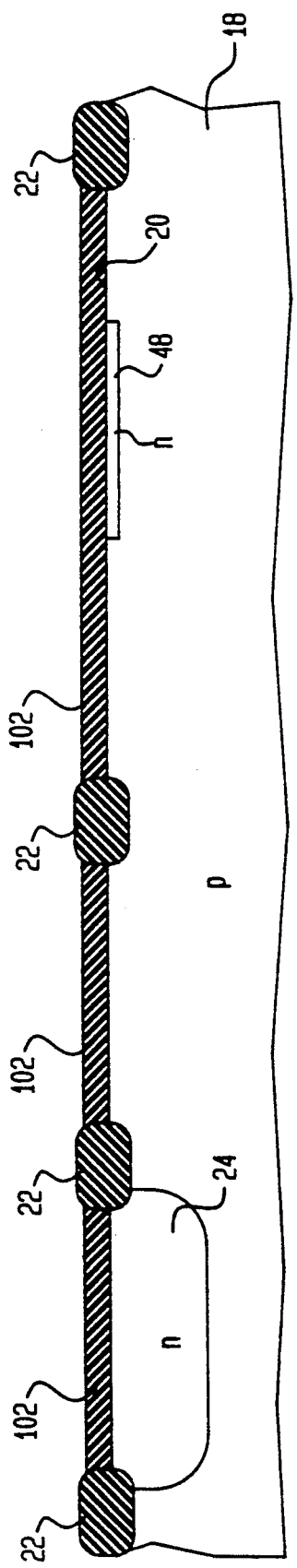

The next step in the standard CMOS process is to grow the gate oxide layer 30 on the substrate surface 20 as shown in FIG. 10. As shown in FIG. 11, a layer 109 of polycrystalline silicon is then deposited over the gate oxide layer 30 and the field oxide regions 22. This is achieved by a low pressure chemical vapor deposition process wherein the substrate 18 is exposed to vapors of a gas containing silicon, such as silane, which is heated to a temperature at which the silane decomposes and deposits polycrystalline silicon on the gate oxide layer 30. The polycrystalline silicon layer 109 is doped with an n-type conductivity modifier, such as phosphorous, by exposing it to a phosphorous containing gas, such as PH$_3$ or POCl$_3$. A masking layer 110 of a photoresist is then coated on the polycrystalline silicon layer 109, and, using standard photolithographic techniques, is defined to leave portions over the areas of the polycrystalline silicon layer 109 which are to form the gates 32, 40 and 64, as shown in FIG. 11. The portions of the polycrystalline silicon layer 109 which are not covered by the masking layer 110 are then removed with a suitable etchant to form the gates 32, 40 and 64 as shown in FIG. 12. The gates 32, 40 and 64 are then heated in an oxidizing atmosphere to form the silicon dioxide layers 34, 42 and 66, respectively, thereover.

The remaining additional steps for forming the EEPROM 16 are now inserted into the process. The first of these additional steps is to apply a masking layer 112 of a photoresist over the gate oxide layer 30 and the gates 32, 40 and 64 as shown in FIG. 13. Using standard photolithographic techniques, an opening 113 is formed in the masking layer 112 over the drain extension 48. The portion of the gate oxide layer 30 exposed by the opening 113 is removed with a suitable etchant to form the window 50 in the gate oxide layer 30. The masking layer 112 is then removed with a suitable etchant. The exposed area of the substrate surface 20 is then heated in an oxidizing atmosphere at a temperature of about 900° C. to form the thin tunnel oxide layer 52 in the window 50.

As shown in FIG. 14, a layer 114 of polycrystalline silicon is then deposited over the gate oxide layer 30, the gates 32, 40 and 64, and in the window 50 to contact the tunnel oxide layer 52. The polycrystalline silicon layer 114 is then doped n-type in the manner previously described. A masking layer 116 of a photoresist is then applied over the polycrystalline silicon layer 114 and, using standard photolithographic techniques, is defined to leave a portion of the masking layer 116 over the area of the polycrystalline silicon layer 114 which is to form the floating gate 54. The uncovered portion of the polycrystalline silicon layer 114 is then removed with a suitable etchant to form the floating gate 54 as shown in FIG. 15. The masking layer 116 is removed from the floating gate 54 with a suitable etchant. The substrate 18 is then heated in an oxidizing atmosphere to form the silicon dioxide layer 56 over the floating gate 54 as shown in FIG. 16.

A layer 118 of silicon nitride is then deposited over the gate oxide layer 30 and the gates 34, 40, 64 and 54, and a layer 120 of polycrystalline silicon is deposited over the silicon nitride layer 118 as shown in FIG. 16. The polycrystalline silicon layer 120 is then doped n-type in the same manner as previously described. A masking layer 122 of a photoresist is applied over the polycrystalline silicon layer 120 and is defined, using standard photolithographic techniques, to provide a portion of the masking layer 122 over the area of the polycrystalline silicon layer 120 which is to form the control gate 60. The exposed portion of the polycrystalline silicon layer 120 and the underlying silicon nitride layer 118 are then removed in succession by suitable etchants. As shown in FIG. 17, this forms the control gate 60 with a composite dielectric layer between the control gate 60 and the floating gate 54 which comprises the silicon nitride layer 58 and the silicon oxide layer 56. After the masking layer 122 is removed from the control gate 60 using a suitable etchant, the control gate 60 is heated in an oxidizing atmosphere to form a silicon dioxide layer 62 thereover as shown in FIG. 17. The steps of forming the polycrystalline gates and the dielectric layers between the gates are carried out at a temperature of no greater than 900° C. This completes the additional steps required to form the EEPROM 16 and the process returns to the standard CMOS process.

As shown in FIG. 18, a masking layer 124 of a photoresist is applied over the substrate surface 18 and is defined to leave a portion thereof only over the well 24. Ions of an n-type conductivity modifier, such as arsenic, are then implanted into the areas of the substrate surface 20 on opposite sides of the gates 40, 64, 54 and 60 as indicated by the arrows 125. This forms the source and drain regions 36 and 38 of the MOS transistor 14, and the source and drain regions 44, 46 and 65 in the EEPROM 16. After removing the masking layer 124 with a suitable etchant, the substrate 18 is heated to anneal the implants. As shown in FIG. 19, a masking layer 126 is then applied over the substrate surface 20 and is defined to cover all of the substrate surface 20 except the well 24. Ions of a p-type conductivity modifier, such as boron, are then implanted into the exposed areas of the substrate 18 as indicated by the arrows 127 to form the source and drain regions 26 and 28 of the MOS transistor 12. After removing the masking layer 126, the substrate 18 is heated to anneal the implant.

A passivation layer 68 of a highly phosphorus doped silicon dioxide is then applied over the substrate surface 20 as shown in FIG. 20 and heated to densify the passivation layer. A masking layer 128 is applied over the passivation layer 68 and provided with openings over the gate, source and drain regions 30, 26 and 28, respectively, of the MOS transistor 12, the gate, source and drain regions 40, 36 and 38, respectively, of the MOS transistor 14, and the source and drain regions 44 and 65, respectively, and gate regions 60 and 64 of the EEPROM 16. The exposed areas of the passivation layer 68 and the portions of the gate oxide layer 30 thereunder are then removed with a suitable etchant to form openings 130, 132, 134, 136, 138, 140, 141, 143, 145 and 147 therethrough to the various gate, source and drain regions therebelow. As shown in FIG. 21, a layer 142 of a metal, such as aluminum, is then coated over the passivation layer 68 and in the openings therein, such as by sputtering or evaporation in a vacuum. The metal layer 142 is then defined to form first level metal contacts 70, 72, 74, 75, 76, 77, 80a, 82a, 83 and 85 and any connecting lines (not shown) between such contacts. The first level metal contacts extend above layer 68 and have nail head-like tops. As shown in FIG. 22, a second passivation layer 78 is then applied over the first passivation layer 68. Openings 144 and 146 are then formed through the passivation layer 78 to the first level metal contacts 80a and 82b, respectively. Although not shown, an additional opening is made to all of the other first level metal contacts. A metal layer 148 is then applied over the passivation layer 78 and fills in the openings 144 and 146 to the first level metal contacts 80a and 82a. The metal layer 148 is defined to form the contacts 80b and 82b as is shown in FIG. 1.

Thus, it can be seen that the integrated circuit 10 is made using the standard steps for making a CMOS integrated circuit having high reliable, narrow gate transistors. The EEPROM 16 is made by merely inserting additional steps relating to the EEPROM into the standard CMOS process in a manner so that the physical structure, electrical characteristics and reliability of the MOS transistors are not affected. The only additional implant step required for the EEPROM 16 is for the drain extension 48, and this is carried out prior to forming the gate oxide layer 30. All of the other additional steps for forming the EEPROM 16 are carried out after the formation of the gate oxide layer 30 and all are carried out at relatively low temperatures, no greater than 900° C. By carrying out these steps at these low temperatures, there is no measurable impact on the MOS transistor device characteristics. Also, the additional steps are carried out after the gates 32 and 40 of the MOS transistors 12 and 14 are formed on the gate oxide layer 30. Thus, the portions of the gate oxide layer 30 which are over the channel regions of the MOS transistors are sealed and protected during the additional steps for forming the EEPROM so as to have minimum adverse affect on the MOS transistors. In addition, a number of the steps used for making portions of the MOS transistors 12 and 14 also form portions of the EEPROM. For example, the gate oxide layer 30 is shared by the MOS transistors 12 and 14 and the EEPROM 16. The polycrystalline silicon layer 106 forms the gates 32 and 40 of the MOS transistors 12 and 14 as well as the gate 64 of the row select line. The implantation step for forming the source and drain regions 36 and 38 of the MOS transistor 14 also forms the source and drain regions, 44, 46 and 65 of the EEPROM. This reduces the number of additional steps required to form the EEPROM 16 so that the overall process is not substantially increased over the standard process for making the MOS circuit.

As previously stated, a problem with incorporating EEPROMs in a CMOS integrated circuit is that some of the physical structural features required to achieve the necessary capacitance differences in the EEPROM to achieve a high density EEPROM circuit are contrary to the structural features required to achieve the high reliable, low voltage characteristics of the CMOS integrated circuit. In the integrated circuit 10 of the present invention, the structural features of the CMOS circuit are maintained to achieve the high reliable, low voltage characteristics of the CMOS circuit. Instead of changing the MOS transistors, the structure features of the EEPROM are changed slightly, by making the EEPROM slightly larger to achieve a higher ratio of the control gate to floating gate capacitance ($C_{cg-fg}$) divided by the floating gate to substrate capacitance ($C_{fg-s}$). The ratio of $C_{cg-fg}/C_{fg-s}$ is about 2 or greater. This provides an EEPROM which will operate at lower programming voltages, typically about 12 volts, which is compatible CMOS circuits that use a five voltage supply voltage and have breakdown voltages of about 17 volts.

The floating gate 54 and the control gate 60 are designed to have a large area of overlap. This provides the EEPROM 16 with a high ratio of the control gate to floating gate capacitance divided by the floating gate to substrate capacitance. In turn, this high capacitance ratio allows a lower programming voltage to be used which is available in a standard, high reliable, narrow gate width CMOS circuit. Thus, in the integrated circuit 10 of the present invention, by making the EEPROM 16 larger than normal, it can be incorporated in a CMOS circuit and can be operated at voltages available in the CMOS circuit. Thus, the EEPROM 16 has negligible impact on the performance characteristics of the CMOS circuit.

In a typical embodiment of integrated circuit 10, the CMOS transistor power supply is +5 volts, the programming voltage used for the EEPROM is +12 volts and the breakdown voltages of the CMOS transistors are about +17 volts. In this embodiment, which uses 1.5 micron design rules (i.e., the minimum channel length and spacing between adjacent conductors), the substrate 18 is of p-type conductivity with an impurity concentration of about $7 \times 10^{+14}$ impurities/cm$^3$, well 24 is of n-type conductivity with an impurity concentration of about $10^{+16}$ impurities/cm$^3$, a width of about 12.5 microns and a depth of about 3.5 microns, regions 26 and 28 are of p-type conductivity with an impurity concentration of about $10^{+19}$ impurities/cm$^3$ and with each having a width of 5.5 microns, a depth of 0.3 microns and being separated by about 1.5 microns, regions 36 and 38 are of n-type conductivity with an impurity concentration of about $10^{+20}$ impurities/cm$^3$ and with each having a width of 5.5 microns, a depth of 0.3 microns and being separated by about 1.5 microns, regions 65 and 46 are of n-type conductivity with an impurity concentration of about $10^{+20}$ impurities/cm$^3$ and with each having a width of 5.5 microns, a depth of 0.3 microns and being separated by about 1.5 microns, region 44 is of n-type conductivity with an impurity concentration of about $10^{+20}$ impurities/cm$^3$ and has a a width of 5.5 microns, a depth of 0.3 microns, region 48 is of n-type conductivity with an impurity concentration of about $10^{+19}$ impurities/cm$^3$ and having a width of 12 microns, a depth of 0.25 microns, the spacing between n-type regions 48 and 44 is about 2 microns. Gate silicon dioxide layer 30 has a thickness of about 400 Angstroms with the portion 52 having a thickness of about 100 Angstroms. The capacitance between control gate 60 and the floating gate 54, Ccg-fg, is about 421 pF and the capacitance between the floating gate 54 and the substrate 18, Cfg-s, is about 77.1 pF. Accordingly, the ratio of Ccg-fg/Cfg-s is 5.46. The contacts are all an aluminum-copper-silicon compound (98% Al, 1% Cu and 1% Si).

The MOS and EEPROM integrated circuit of the present invention is particularly useful when the design rules are for about 2 microns or less and Ccg-fg/Cfg-s is about 2 or greater.

Thus, there is provided by the present invention an integrated circuit which comprises a high reliable, narrow gate CMOS circuit and an EEPROM circuit wherein the EEPROMs are designed to operate at the low voltages available in the CMOS circuit so that there is negligible impact on the operating characteristics of the CMOS circuit. In addition, the present invention provides a method of making the integrated circuit wherein the standard process for making the CMOS circuit is used and the EEPROM is formed by steps which are added to the standard CMOS process and are inserted in a manner so that they do not adversely affect the operating characteristics of the resulting circuit.

It is to be understood that the embodiments of the invention which have been described are illustrative of the invention. Modifications may readily be devised by those skilled in the art without departing from the spirit and scope of the invention. For example, the CMOS process described herein is a typical conventional process, it is possible to make many modifications thereto. Still further, the steps of the EEPROM process described herein can be modified, such as the use of steps performed at temperatures above 900° C. so long as those high temperature steps are accomplished before the gate oxide layer of the CMOS transistors is formed.

The embodiments of the invention in which an exclusive property or privilege are claimed are defined as follows:

1. A method of making an integrated circuit in a substrate of a semiconductor material which includes an MOS transistor and an EEPROM comprising the steps of:
   forming the MOS transistor using a CMOS processing having about two micron or less design rules; and
   forming the EEPROM using additional steps which do not substantially adversely impact the characteristics of the MOS transistor being formed about 2 micron or less design rule CMOS process and wherein the EEPROM has a control gate and a floating gate with a ratio of the floating gate to control gate capacitance to the floating gate to substrate capacitance of about two or greater effective to allow charging of the EEPROM floating gate at voltages within the voltage capability of the MOS transistor.

2. The method of claim 1 wherein one of the steps for forming the MOS transistor comprise forming a gate oxide layer on a surface of the substrate, and any additional steps for forming the EEPROM which are carried out at a temperature of greater than 900° C. are carried out prior to forming the gate oxide layer and the remaining additional steps for forming the EEPROM which are carried out after the gate oxide layer is formed are carried out at a temperature of no greater than 900° C.

3. The method of claim 2 wherein the steps of forming the MOS transistor also comprise forming a conductive gate for the MOS transistor on the gate oxide layer, and the remaining additional steps for forming the EEPROM are carried out after the MOS transistor gate is formed.

4. The method of claim 3 wherein the additional steps for forming the EEPROM which are carried out prior to forming the gate oxide layer comprises forming in the substrate a drain extension of a conductivity type opposite the conductivity type of the substrate.

5. The method of claim 4 wherein the additional steps for forming the EEPROM which are carried out after the MOS transistor gate is formed comprise forming an opening in the gate oxide layer over the drain extension, forming a tunnel oxide layer on the substrate surface in the opening, said tunnel oxide being thinner than the gate oxide layer, forming a conductive floating gate on the gate oxide layer and the tunnel oxide layer over the drain extension, and forming a conductive control gate over and dielectrically insulated from the floating gate.

6. The method of claim 5 in which prior to forming the control gate on the floating gate the steps of forming a layer of silicon dioxide on the floating gate, forming a layer of silicon nitride on the silicon dioxide layer, and then forming the control gate on the silicon nitride layer.

7. The method of claim 6 in which after the gates of the EEPROM are formed, the steps of forming in the substrate source and drain regions for the MOS transistor and the EEPROM.

8. The method of claim 7 in which the source and drain regions of the EEPROM are formed simultaneously with the source and drain regions of the MOS transistor.

9. The method of claim 8 in which a row select gate for the EEPROM is formed on the gate oxide layer at the same time as the gate of the MOS transistor.

10. The method of claim 9 in which the floating gate and control gate of the EEPROM are formed with large overlapping areas to provide a large capacitance therebetween.

11. A method of making an integrated circuit using about two micron or less design rules comprising the steps of:
   (a) forming in a substrate of a semiconductor material of one conductivity type a well of the opposite conductivity type which extends into the substrate from a surface thereof;
   (b) forming along said substrate surface spaced field isolation regions of silicon dioxide with the well being between two of the field regions;

(c) forming in said substrate between two of said field regions spaced from the well an EEPROM drain extension of the opposite conductivity type, said drain extension region extending into the substrate from said surface;

(d) forming a gate silicon dioxide layer on said substrate surface;

(e) forming a pair of spaced conductive gates on said gate oxide layer with one of the gates being over the well and the other gate being over a portion of the substrate between two field regions;

(f) then forming an opening in the gate oxide layer over the drain extension region and forming a tunnel oxide layer thinner than the gate oxide layer on the substrate surface within the opening;

(g) then forming an EEPROM, conductive floating gate on the gate oxide layer and the tunnel oxide layer over the drain extension and a conductive control gate over and dielectrically insulated from the floating gate said electrodes providing an electrical capacitance between themselves and with said substrate, wherein the capacitance between said electrodes in at least double the capacitance between said floating gate and said substrate, effective to allow charging of said floating gate at voltages below about 17 volts; and (h) then forming source and drain regions of the one conductivity type in the well at opposite sides of the one gate, source and drain regions of the opposite conductivity type in the substrate at opposite sides of the other gate, and source and drain regions of the opposite conductivity type in the substrate at opposite sides of the floating and control gates.

12. The method of claim 11 wherein after the pair of conductive gates are formed on the gate oxide layer, all the further steps are carried out at a temperature of no greater than 900° C.

13. The method of claim 12 wherein the source and drain regions of the opposite conductivity type are all formed simultaneously and separately from the source and drain regions of the one conductivity type.

14. The method of claim 13 wherein all of the source and drain regions and the drain extension region are formed by implanting ions of a conductivity modifier of the appropriate conductivity type into the substrate.

15. The method of claim 14 wherein all of the gates are formed of conductivity polycrystalline silicon.

16. The method of claim 15 wherein after the floating gate is formed the steps of forming a layer of silicon dioxide on the floating gate, forming a layer of silicon nitride on the silicon dioxide layer and forming the control gate on the silicon nitride layer.

17. The method of claim 11 comprising the additional step of forming a conductive row select gate on the gate oxide layer adjacent but spaced from the drain extension at the same time that the pair of conductive gates are formed.

18. The method of claim 18 wherein the drain of the EEPROM is formed between the row select gate and the control gate and contacts the drain extension, and a row select gate drain region of the opposite conductivity type is formed in the substrate at the side of the row select gate opposite the drain of the EEPROM.

19. The method of claim 11 wherein the floating gate and control gate of the EEPROM are formed such that the ratio of capacitance between the two to capacitance between the floating gate and the substrate is about two or greater.

20. A method of making an integrated circuit in a substrate of a semiconductor material which includes a pair of complementary MOS transistors and an EEPROM comprising the steps of:

forming the complementary MOS transistors having a breakdown voltage of about 17 volts or less using process steps from an MOS process having about two micro or less design rules; and forming the EEPROM where the additional steps do not substantially by using some of the MOS transistor process steps and adding some additional process steps that do not adversely impact operating speed and/or breakdown voltages of the MOS transistors being formed and wherein the EEPROM has a control gate and a floating gate with a ratio of capacitance of the floating gate to control gate to capacitance of a floating gate to substrate of about two or greater, effective to allow charging of said EEPROM floating gate to be controlled by one or more of said complementary MOS transistors.

21. A method of making an integrated circuit using about two micron or less design rules comprising the steps of:

forming along a surface of a substrate of a first conductivity type spaced apart field isolation regions of silicon dioxide;

forming in said substrate between two of said field regions an EEPROM drain extension region of the opposite conductivity type, said drain extension region extending into the substrate from said surface;

forming a gate silicon dioxide layer on said substrate surface;

forming a conductive MOS transistor gate on said gate oxide layer over a portion of the substrate between two field regions spaced from the portion in which the EEPROM drain extension region is formed;

forming an opening in the gate oxide layer over the drain extension region and then forming a tunnel oxide layer, which is thinner than the gate oxide layer, on the substrate surface within the opening;

forming an EEPROM conductive floating gate on the gate silicon dioxide layer and on the tunnel oxide layer over the drain extension region and then forming a conductive control gate over and dielectrically insulated from the floating gate, wherein the ratio of the capacitance between the floating gate and the conductive control gate to the capacitance between the floating gate and the substrate is about two or greater and the floating gate can be charged by high speed MOS transistors in said integrated circuit at significantly less than 17 volts; and forming source and drain regions of the opposite conductivity type in the substrate opposite the conductive MOS transistor gate, and forming regions of the opposite conductivity in the substrate at opposite sides of the first conductive gate and the floating and control gates.

22. The method of claim 21 wherein after the conductive MOS transistor is formed on the gate oxide layer, all the further steps are carried out at a temperature of no greater than 900° C.

23. The method of claim 22 further comprising the step of forming a pair of spaced apart conductive gates on the gate silicon dioxide layer with each of said gates being between a separate pair of field isolation regions, and forming a separate source and drain region in the substrate at the sides of each of said gates.

24. The method of claim 23 further comprising the steps of forming a well of the opposite conductivity type in the substrate between two field isolation regions, and forming one of said gates over the well at opposite sides of one gate.

25. The method of claim 24 wherein the source and drains regions formed in the well are of the one conductivity type and the source and drain regions formed directly in the substrate are of the opposite conductivity type.

26. The method of claim 23 in which the well is formed prior to forming the field isolation regions.

27. The method of claim 26 wherein the source and drain regions of the opposite conductivity type are all formed simultaneously and separately from the source and drain regions of the one conductivity type.

28. The method of claim 27 wherein all of the source and drain regions and the drain extension region are formed by implanting ions of a conductivity modifier of the appropriate conductivity type into the substrate.

29. The method of claim 28 wherein all of the gates are formed of conductivity polycrystalline silicon.

30. The method of claim 29 wherein after the floating gate is formed the steps of forming a layer of silicon dioxide on the floating gate, forming a layer of silicon nitride on the silicon dioxide layer and forming the control gate on the silicon nitride layer effective to provide a capacitance between the control gate and the floating gate that is at least about five times the capacitance between the floating gate and the substrate.

31. The method of claim 21 comprising the additional step of forming a conductive row select gate on the gate oxide layer adjacent but spaced from the drain extension at the same time that the pair of conductive gates are formed.

32. The method of claim 31 wherein the drain of the EEPROM is formed between the row select gate and the control gate and contacts the drain extension, and a row select gate drain region of the opposite conductivity type is formed in the substrate at the side of the row select gate opposite the drain of the EEPROM.

33. A method of making an integrated circuit using about two micron or less design rules comprising the steps of:

forming in a semiconductor substrate of one conductivity type a well of the opposite conductivity type which extends into the substrate from a surface thereof;

forming along the surface of the substrate spaced apart field isolation regions of silicon dioxide;

forming in said substrate between two of said field regions an EEPROM drain extension region of the opposite conductivity type, said drain extension region extending into the substrate from said surface;

forming a gate silicon dioxide layer on said substrate surface;

forming a first conductive MOS transistor gate on said gate oxide layer over a portion of the substrate between two field regions spaced from the portion in which the EEPROM drain extension region is formed, forming a second conductive MOS transistor gate of said gate oxide over the well, and forming a first conductive gate over said gate oxide layer over a portion of the substrate between two field regions in which the drain extension region exists but spaced apart from the drain extension region;

forming an opening in the gate oxide layer over the drain extension region and then forming a tunnel oxide layer, which is thinner than the gate oxide layer, on the substrate surface within the opening;

forming an EEPROM conductive floating gate on the gate silicon dioxide layer and on the tunnel oxide layer over the drain extension region and then forming a conductive control gate over and dielectrically insulated from the floating gate, wherein the ratio of the capacitance between the floating gate and the conductive control gate to the capacitance between the floating gate and the substrate is about 2-5 or greater and the floating gate can be charged by high speed MOS transistors in said integrated circuit at significantly less than 17 volts; and forming source and drain regions of the opposite conductivity type in the substrate opposite the conductive MOS transistor gate, forming regions of the opposite conductivity in the substrate at opposite sides of the first conductive gate and the floating and control gates, and forming source and drain regions in the well on opposite sides of the MOS transistor gate over the well.

34. The method of claim 33 wherein channel lengths and spacing between adjacent conductors is chosen in accordance with 1.5 micron design rules and the ratio of the capacitance between the floating gate and the conductive control gate to the capacitance between the floating gate and the substrate is about five or more.

* * * * *